United States Patent
Onishi

(10) Patent No.: US 10,614,994 B2
(45) Date of Patent: Apr. 7, 2020

(54) ELECTRON MICROSCOPE

(71) Applicant: Hitachi High-Technologies Corporation, Minato-ku, Tokyo (JP)

(72) Inventor: Takashi Onishi, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 16/335,309

(22) PCT Filed: Sep. 23, 2016

(86) PCT No.: PCT/JP2016/077926
§ 371 (c)(1),
(2) Date: Mar. 21, 2019

(87) PCT Pub. No.: WO2018/055715
PCT Pub. Date: Mar. 29, 2018

(65) Prior Publication Data
US 2019/0279837 A1    Sep. 12, 2019

(51) Int. Cl.
*H01J 37/073*    (2006.01)
*H01J 37/26*    (2006.01)
(Continued)

(52) U.S. Cl.
CPC ............ *H01J 37/073* (2013.01); *H01J 7/18* (2013.01); *H01J 37/16* (2013.01); *H01J 37/26* (2013.01);
(Continued)

(58) Field of Classification Search
None
See application file for complete search history.

(56) References Cited

U.S. PATENT DOCUMENTS

| 4,019,077 A | * | 4/1977 | Sakitani | H01J 1/304 313/441 |
| 2006/0076489 A1 | * | 4/2006 | Ohshima | H01J 37/244 250/310 |

(Continued)

FOREIGN PATENT DOCUMENTS

| JP | 51-72278 A | 6/1976 |
| JP | 2007-311117 A | 11/2007 |

(Continued)

OTHER PUBLICATIONS

International Search Report (PCT/ISA/210) issued in PCT Application No. PCT/JP2016/077926 dated Dec. 20, 2016 with English translation (three (3) pages).

(Continued)

*Primary Examiner* — Andrew Smyth
(74) *Attorney, Agent, or Firm* — Crowell & Moring LLP

(57) ABSTRACT

The present invention is to provide an electron microscope capable of being activated to an appropriate temperature by disposing an NEG at an extraction electrode around an electron source. The present invention is an electron microscope provided with an electron gun, in which the electron gun includes an electron source, an extraction electrode, and an accelerating tube, the accelerating tube is connected to the extraction electrode at a connection portion, the extraction electrode includes a first heater and a first NEG, and the first heater and the first NEG are spaced apart in an axial direction of an electron beam emitted from the electron source.

11 Claims, 3 Drawing Sheets

(51) Int. Cl.
*H01J 7/18* (2006.01)
*H01J 37/16* (2006.01)
*H01J 37/28* (2006.01)
*H01J 37/141* (2006.01)

(52) U.S. Cl.
CPC .............. *H01J 37/28* (2013.01); *H01J 37/141* (2013.01); *H01J 2237/06341* (2013.01); *H01J 2237/22* (2013.01)

(56) References Cited

U.S. PATENT DOCUMENTS

| | | | | |
|---|---|---|---|---|
| 2008/0067396 | A1* | 3/2008 | Ohshima | H01J 37/143 250/396 ML |
| 2008/0284332 | A1* | 11/2008 | Adamec | H01J 7/18 313/558 |
| 2012/0085925 | A1* | 4/2012 | Kasuya | B82Y 40/00 250/453.11 |
| 2012/0217391 | A1* | 8/2012 | Shichi | H01J 27/26 250/306 |
| 2013/0087703 | A1* | 4/2013 | Onishi | H01J 37/065 250/306 |
| 2017/0309437 | A1* | 10/2017 | Agemura | H01J 37/18 |

FOREIGN PATENT DOCUMENTS

| | | | |
|---|---|---|---|
| JP | 2015-15200 A | | 1/2015 |
| WO | WO 2005/124815 A1 | | 12/2005 |
| WO | WO 2015/004981 A1 | | 1/2015 |
| WO | WO-2016063325 A1 * | 4/2016 | .............. H01J 37/18 |

OTHER PUBLICATIONS

Japanese-language Written Opinion (PCT/ISA/237) issued in PCT Application No. PCT/JP2016/077926 dated Dec. 20, 2016 (three (3) pages).

* cited by examiner

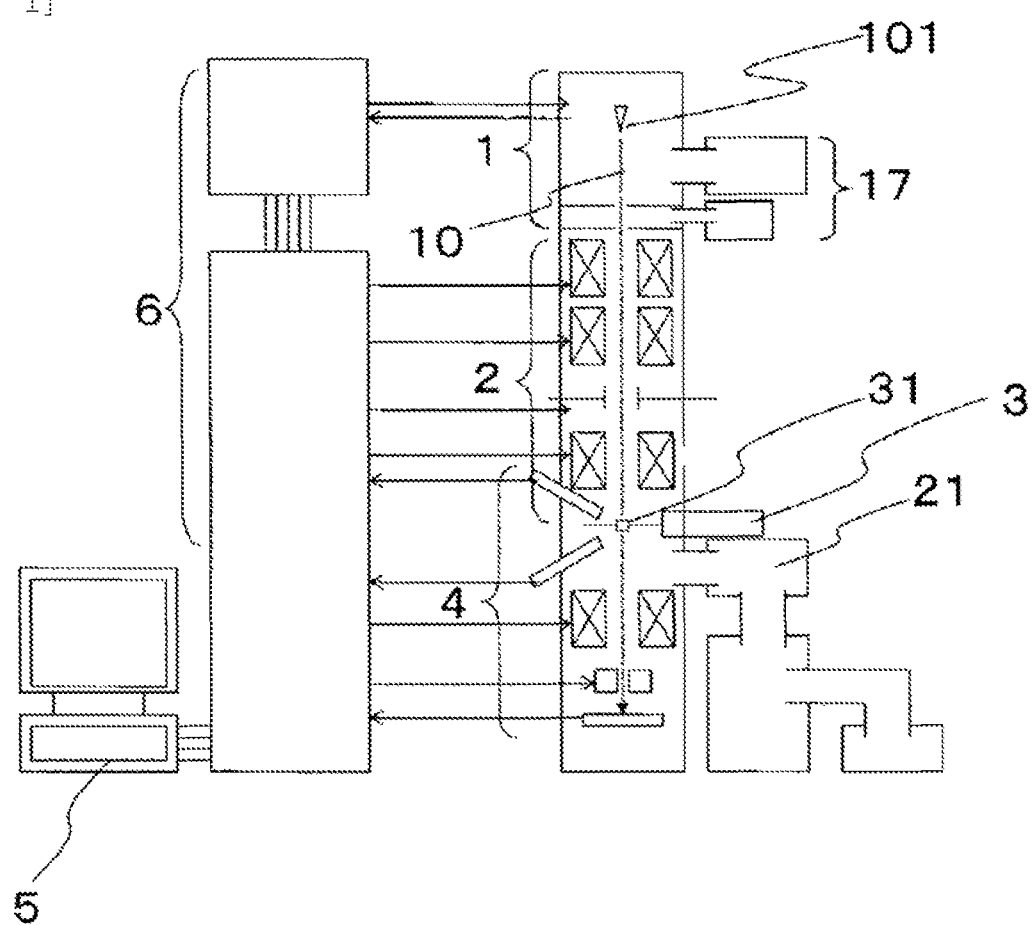
[FIG. 1]

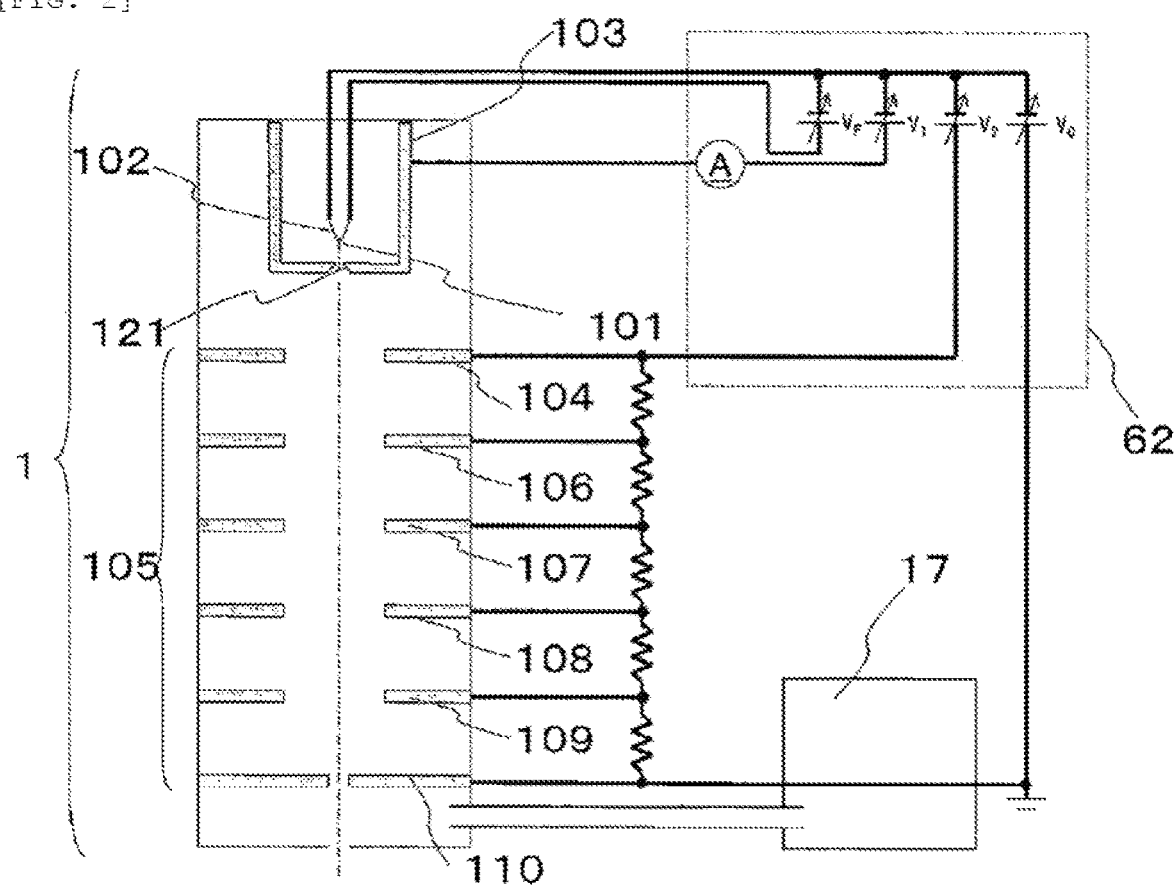
[FIG. 2]

[FIG. 3]
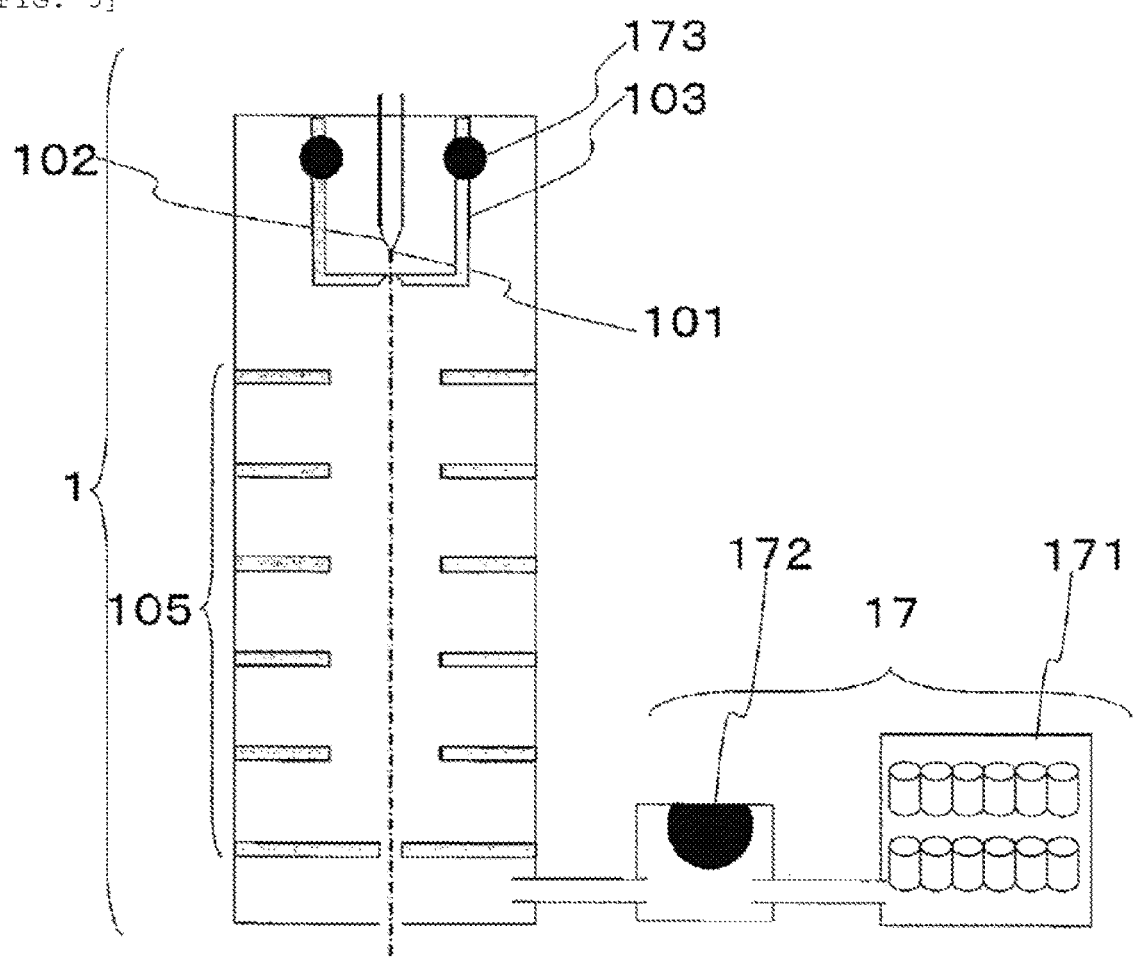
[FIG. 4]
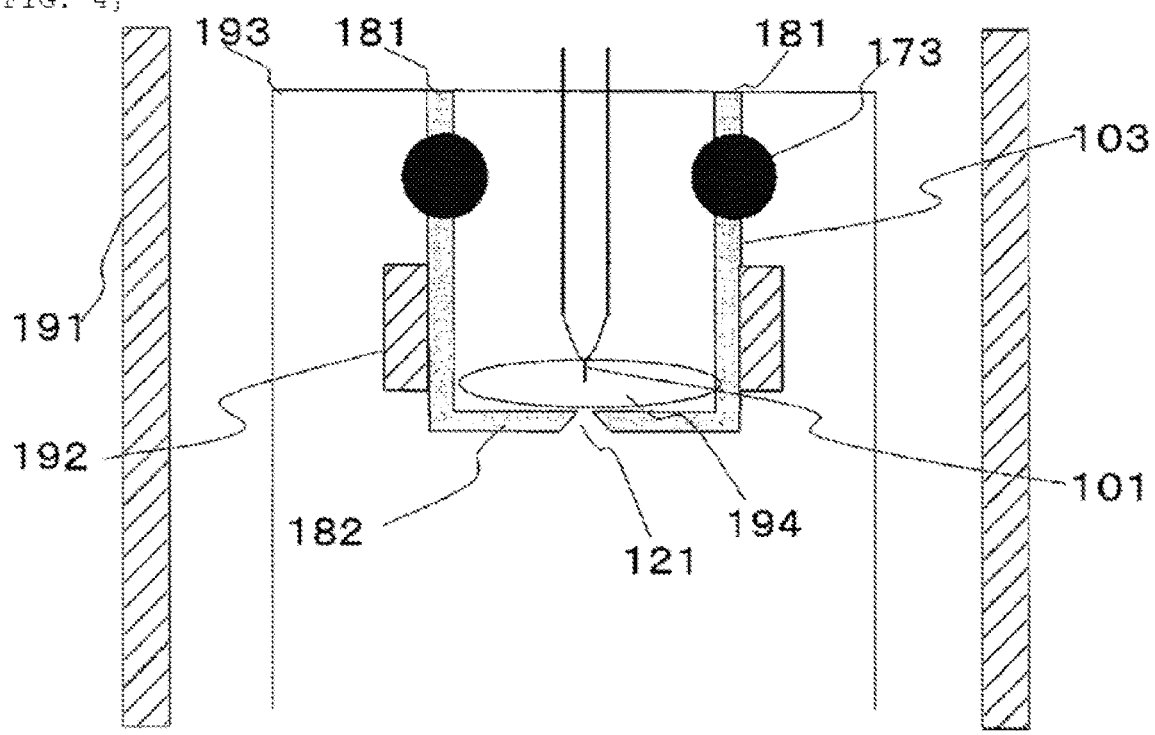

ELECTRON MICROSCOPE

TECHNICAL FIELD

The present invention relates to an electron microscope provided with an electron gun.

BACKGROUND ART

An electron microscope is an observation device which obtains an enlarged image of a specimen and information of constituent elements by using an electron beam. In the electron microscope, a precise enlarged image of the specimen and an elemental-composition analysis result of the specimen are obtained by an electron beam. For this reason, the role of an electron gun generating an electron beam plays a large role.

It is important for the electron gun to keep the internal residual gas pressure thereof low. To pump residual gas molecules in the electron gun and keep the molecules at low pressure, the electron gun is provided with a vacuum pump such as an ion pump (sputter ion pump). An ion pump is a device that ionizes residual gas molecules in a vacuum container by collision with an electron beam and pumps residual gas by the occlusion of the gas in an inner wall.

Furthermore, in recent years, a non-evaporable getter (NEG) pump suitable for pumping residual hydrogen molecules has been used in combination with an ion pump. PTL 1 discloses an electron gun provided with an ion pump and an NEG. Furthermore, PTL 2 discloses an electron gun provided with an NEG around an electron source.

CITATION LIST

Patent Literature

PTL 1: JP-A-2015-15200
PTL 2: WO 2005-124815

SUMMARY OF INVENTION

Technical Problem

Keeping the residual gas in the electron gun low is important in reducing the flashing frequency and reducing the frequency of replacing the electron source. In the electron microscope described in PTL 1, it is possible to keep the residual gas low by being provided with both the ion pump and the NEG. The NEG is a porous metal rod and employs chemisorption on metal atoms of a surface as a pumping principle. Before using the NEG, atmospheric molecules are absorbed on a metal surface and are in an inactive state, but by heating the NEG to a high temperature of about 450° C. in vacuum, the gas molecules on the pump surface are emitted into vacuum or sorb inside the NEG, and the metal atoms on the surface become chemically active <activation>. The activated NEG sorbs and pumps residual gas molecules such as hydrogen, nitrogen, carbon monoxide.

In the case of an electron microscope as described in PTL 1, it is not possible to activate an NEG unless a heater dedicated to the NEG is provided to activate the NEG. Furthermore, at the time of baking of an electron gun or the like, a heater dedicated to the NEG must be activated and heated to a temperature of an activated state. In PTL 2, a coil-shaped heater is wound around an NEG, and the NEG is electrically heated to become activated. Therefore, it is necessary to dispose a coil dedicated to the NEG around the electron source. Furthermore, when the NEG is activated, a large amount of gas molecules are emitted from the NEG and absorbed to surrounding components or the electron source, which may adversely affect the performance of the electron source.

The present invention has been accomplished in view of the above problems, and the object thereof is to provide a means for appropriately activating an NEG while disposing the NEG around an electron source without using a heater for activating the NEG.

Solution to Problem

The features of the present invention for solving the above problems are as follows.

That is, the present invention is an electron microscope provided with an electron gun, in which the electron gun includes an electron source, an extraction electrode, and an accelerating tube, the accelerating tube is connected to the extraction electrode at a connection portion, the extraction electrode includes a first heater and a first NEG, and the first heater and the first NEG are spaced apart in an axial direction of an electron beam emitted from the electron source.

Advantageous Effects of Invention

According to the present invention, it is possible to obtain a stable emission current without exchanging the electron source for a longer period of time without using a separate heater for the NEG by disposing the appropriately activated NEG particularly on the extraction electrode around the electron source. Thereby, it is possible to obtain an electron microscope which does not require long-term maintenance and obtains an observation image which has been more stabilized for a longer time.

BRIEF DESCRIPTION OF DRAWINGS

FIG. 1 is a diagram showing an electron microscope in one embodiment of the invention.

FIG. 2 is a diagram showing an electron gun in one embodiment of the invention.

FIG. 3 is a diagram showing a configuration of a vacuum pump of a Cold-FE electron gun.

FIG. 4 is an enlarged diagram showing a structure around an electron source.

DESCRIPTION OF EMBODIMENTS

An electron microscope is mainly composed of an electron gun, an electron optics system, a specimen holder, a detector, an operation unit, and a power supply unit. The electron gun is a device for generating an electron beam. The electron optics system is a device that transports electrons generated by the electron gun and irradiates a specimen with the electrons. The electron optics system also has a function of converging and deflecting an electron beam by an electromagnetic lens. The specimen holder is a device that fixes a material (specimen) to be observed on an electron beam path in the electron optics system and moves and tilts the material as necessary.

In order to irradiate the specimen with the electron beam emitted from the electron gun without colliding with air molecules, the interior of the electron gun needs to be kept at a vacuum. Therefore, the electron microscope is provided with a vacuum pump. Electrons irradiated on the specimen generate reflected electrons, secondary electrons, transmitted electrons, scattered electrons, X-rays, and the like by interaction with atoms constituting the specimen. In the detector, these electrons and X-rays are measured. In addition, the fluorescence produced by the electron beam transmitted through the specimen is obtained as a specimen image by a fluorescent plate.

The power supply unit supplies electric power necessary for the operation of the electron gun, the electron optics system, the detector and the like and performs precise control. The operation unit controls the power supply, analyzes the information obtained by the detector, processes the information as a magnified image of the specimen and the elemental composition of the specimen in an easy-to-see state for an operator, displays, and records the information. Here, the electron gun is a device that generates electrons used for observation as free electrons in vacuum. Furthermore, in the electron gun, the generated free electrons are accelerated by the differential electric potential to become a group of electrons having kinetic energy, that is, an electron beam. The quantity of electron per unit time generated by the electron source in the electron gun is called an emission current.

Hereinafter, a cold cathode field-emission (Cold-FE) electron gun, which is one type of electron gun, will be described. In the Cold-FE electron gun, as the electron source, a tungsten single crystal whose tip is sharply pointed by electrolytic polishing is used. An extraction electrode is provided close to the electron source. An extraction voltage of several kilovolts is applied between the extraction electrode and the electron source. Then, due to the pointed shape of the electron source, electric field concentration occurs at the tip of the electron source, and a high electric field is generated. Due to this high electric field, electrons are emitted from the tip of the electron source due to field emission. In the Cold-FE electron gun, the total amount of the electron beams emitted in this way from the electron source by the field emission is the emission current described above.

The magnitude of the emission current is affected not only by the extraction voltage (and eventually the electric field intensity at the tip of the electron source) but also by the surface state of the electron source. A Cold-FE electron source is placed in the electron gun whose residual gas pressure is lowered by the vacuum pump. However, when slightly remaining gas molecules are absorbed by the electron source, the work function of the electron source generally decreases, and the emission current amount at the same electric field intensity decreases. Therefore, as the residual gas molecules collide with the electron source and are absorbed, the amount of emission electron decreases. As a result, under the condition of applying a constant extraction voltage, the emission current gradually decreases during the operation of the electron gun.

As described above, since the emission current of the Cold-FE electron gun is influenced by the surface state of the electron source, for stable use, it is necessary to clean the surface of the electron source by re-emitting gas molecules absorbed on the surface of the electron source in vacuum or the like. This is accomplished by instantaneously heating the single crystal. Therefore, many Cold-FE electron guns have a mechanism that welds an electron source to the tip of a filament, heats the electron source by electrically heating the filament for a short time, and performs cleaning. This operation is called flashing. When flashing is performed, the tip of the electron source is cleaned. In the Cold-FE electron gun, this flashing is periodically performed to obtain a constant emission current.

Here, by keeping the residual gas pressure in the electron gun low, a necessary flashing frequency decreases and the electron source can be used without performing flashing for a long time (approximately several hours to one day). This is because the adsorption frequency of the residual gas molecules to the electron source decreases and the temporal change in the surface state becomes slow. In order to perform better specimen observation such as acquiring various specimen images under the same conditions and obtaining element analysis results, it is important to obtain a stable emission current for a long period without operating flashing and extraction voltage.

In addition, the advantage of reducing the flashing frequency also has an effect of extending the lifetime of the electron source. Flashing is an operation of heating an electron source for a short time to remove absorbed gas molecules, but since flashing causes thermal drift of tungsten atoms at the tip of the electron source, the physical shape of the tip portion gradually changes each time flashing is repeated. This change is usually a change toward the direction in which the physical shape of the sharply pointed tip portion gradually becomes rounded due to the attractive force acting on the atoms in the crystal (this is called "rounded" at the tip portion of the electron source). Therefore, when the flashing is repeated, the radius of curvature of the tip of the electron source gradually increases, which accordingly leads to the result that the concentration of the electric field at the tip portion of the electron source is weakened. As the electric field concentration is weakened, in order to obtain the same emission current, it is necessary to raise the extraction voltage. If the extraction voltage is determined so as to maintain a constant emission current, the extraction voltage gradually rises over the utilization period (roughly, from months to years) of the electron gun. When this extraction voltage exceeds a limit of voltage (depends on the capability of the power source and the insulation performance inside the wiring and the electron gun) of the electron gun, sufficient emission current cannot be obtained from this electron source, and it becomes necessary to replace the electron source. In order to replace the electron source and restart the device, it is usually necessary to stop the vacuum pump. In particular, in order to reduce the molecular weight of residual gas in the electron gun to an extent necessary for a long-time stabilization of the emission current, it is necessary to heat the electron gun (baking) in addition to the pumping by the vacuum pump. Since the gas molecules absorbed on the inner wall of the electron gun are promptly emitted by baking, and the molecular weight of residual gas after pumping by the vacuum pump is greatly reduced, baking is essential. The electron gun is baked with various heaters and then cooled to room temperature to be used, but this process requires about one week's work.

Therefore, it is possible to reduce the replacement frequency of the electron source by reducing the frequency of flashing, and it is possible to reduce the necessary maintenance frequency and keep the running cost of the device low.

FIG. 1 shows an electron microscope provided with a Cold-FE electron gun as an example of an embodiment of the invention. The electron microscope has an electron gun 1, an electron optics system 2, a specimen holder 3, a detector 4, an operation unit 5, and a power supply unit 6. In FIG. 1, the electron gun 1 and the electron optics system 2 respectively have vacuum pumps 17 and 21, but depending on the scale of the electron microscope, there may be a case where a single vacuum pump is provided, or there may be a case where a large number of subdivided vacuum pumps are provided.

An electron gun 1 provided with a Cold-FE electron source 101 generates an electron beam 10. The electron optics system 2 converges and deflects the electron beam 10 and irradiates a specimen 31. The sample holder 3 holds the specimen 31 and moves, tilts, and exchanges the specimen 31 as necessary. The detector 4 measures reflected electrons, secondary electrons, transmitted electrons, scattered electrons, X-rays, and the like generated by the specimen 31. The power supply unit 6 supplies power to the electron gun 1 and the electron optics system 2, and adjusts the output and controls the electron beam to a state to be requested by the operator. In addition, information from the detector 4 is converted into a digital signal. The operation unit 5 controls the electron gun 1 and the electron optics system 2 through a power supply system 6, processes information from the detector 4, and displays or records the information in a form visible to the operator.

FIG. 2 shows details of the structure of the Cold-FE electron gun 1 having an acceleration voltage of several hundred kilovolts according to an embodiment of the present invention. The electron gun 1 is provided with an electron source 101 (Cold-FE electron source), an extraction electrode 103, and an accelerating tube 105. The electron source 101 and the extraction electrode 103 are connected to an electron gun power supply 62 which is a part of the power supply system 6 in FIG. 1. The accelerating tube 105 is a cylindrical tube provided with electrodes 104, 106, 107, 108, 109, and 110 and mutually connecting the electrodes with an insulator. Since being insulated from the ground level by the accelerating tube 105, the electron gun power supply 62 may apply a high potential to the electron source 101, the extraction electrode 103, and the like. The electrode 110 has a ground level.

To the extraction electrode 103, an extraction voltage (V1) of several kilovolts is applied by the electron gun power supply 62 with reference to the electron source 101. Since the electron source 101 has a sharply pointed tip shape, a strong electric field is generated at the tip portion of the electron source 101. At this time, the electrons emitted from the electron source 101 are initially accelerated by the potential difference between the electron source 101 and the extraction electrode 103 based on the principle of field emission and are irradiated to the extraction electrode 103. This is the emission current. A part of the emission current passes through the hole of an anode aperture 121 provided in the extraction electrode 103 and enters the accelerating tube 105. The accelerating tube 105 is provided with a plurality of interspace electrodes 104, 106, 107, 108, and 109, and the electron beam passes through the interspace electrodes and is further accelerated. The electron source 101 and the extraction electrode 103 are under a negative high voltage (V0) of several hundred kilovolts by the electron gun power supply 62. The anode 110 is at a ground level and is at zero potential. The electron beam is accelerated by this potential difference, and the electrons which have passed through the anode 110 are electron beams having energy of V0.

In order to prevent collision with the air molecules of the electron beam, and to prevent collision of residual gas molecules to the surface of the electron source 101 and keep the surface of the electron source 101 in a clean state, the electron gun 1 including the accelerating tube 105 constitutes a vacuum container. The interior of the electron gun is pumped by the vacuum pump 17.

Next, the configuration of the vacuum pump of the Cold-FE electron gun will be described with reference to FIG. 3. The electron gun 1 is a vacuum container provided with the electron source 101, a filament 102, the extraction electrode 103, and the accelerating tube 105. The interior of the electron gun 1 is pumped by the vacuum pump 17. The vacuum pump 17 is composed of an ion pump 171 and a NEG 172. The ion pump 171 is a sputter ion pump that pumps residual gas molecules in the electron gun according to the principle of ionization and absorption. The NEG 172 is a non-evaporable getter pump that chemically sorbs residual gas molecules in the electron gun to pump the residual gas molecules. In FIG. 3, the NEG 172 is installed between the electrode 110 having the ground level of the accelerating tube and the ion pump 171. As described above, in order to obtain an electron gun that generates a stable emission current, it is necessary to reduce residual gas molecules around the electron source 101 as much as possible. The ion pump 171 and the NEG 172 are capable of pumping the residual gas molecules. On the other hand, however, the electron gun 1 essentially has a complicated structure such as the accelerating tube 105 as the structure thereof. For this reason, because the ion pump 171 and the NEG 172 provided at a position distant from the electron source 101 need to pump residual gas molecules around the electron source 101 through a long and narrow tube, the pumping efficiency is poor. It is difficult to pump residual gas molecules around the electron source 101 to a sufficient extent to obtain a stable emission current for a long time (several hours to one day).

Here, in the embodiment of the present invention, the NEG 173 is provided in the vicinity of the electron source 101. The NEG 173 efficiently sorbs residual gas molecules around the electron source 101 and enables the electron gun 1 to stably emit the emission current for a long time. One NEG 173 is provided in the vicinity of the electron source 101 in FIG. 4, but many NEGs 173 may be provided instead of one. It is possible to allow residual gas molecules to be absorbed more efficiently by being provided with one or more.

In addition to the ion pump 171 and the NEG 172, the NEG 173 is provided in the vicinity of the electron source 101, particularly on the extraction electrode, and therefore the number of residual gas molecules colliding with the electron source can be greatly reduced.

When providing the NEG 173 in the vicinity of the electron source 101, in the embodiment of the present invention, the extraction electrode 103 is provided with the NEG 173. An enlarged diagram showing the structure around the electron source 101 and the NEG 173 is shown in FIG. 4.

FIG. 4 is a schematic diagram showing the structure of the electron source 101 in a state where the electron gun 1 is being adjusted. The interior of the electron gun 1 is baked by a heater 191 placed around the electron gun while being pumped by a vacuum pump (not shown). The heater 191 is disposed in the air outside the vacuum container.

In the embodiment of the present invention, the extraction electrode 103 is provided with an inner heater 192. The inner heater 192 is a heater placed in the vacuum container of the electron gun 1. An electric current is introduced into the vacuum by a feedthrough (not shown) and serves as a heat source for the inner heater 192. The inner heater 192 is always energized during the baking of the electron gun and plays a role of particularly strongly heating the extraction electrode 103. Since the extraction electrode 103 has a role of absorbing much of the electron beam generated from the electron source 101 during use of the electron source, the inner heater 192 particularly bakes the extraction electrode 103 at a high temperature and causes the gas molecules absorbed on the extraction electrode periphery 194 to be emitted. Thereby, collision of residual gas molecules on the surface of the electron source 101 can be prevented, and the electron source surface 101 can be kept in a clean state. The appropriate temperature of the heater 191 is about 350° C. which is 300° C. or higher, but the appropriate temperature of the inner heater 192 is about 450° C. which is 400° C. or higher.

Here, the NEG 173 is attached between the inner heater 192 of the extraction electrode 103 and a connection portion 181 where the extraction electrode 103 is in contact with the outer wall 193 of the accelerating tube and is heated by a thermal gradient. Here, the temperature around a leading end portion 182 of the extraction electrode is heated by the inner heater 192 to about 450° C. As being heated by the heater 191 via the air, the temperature of the connection portion 181 of the outer wall 193 of the accelerating tube is lower than the heater 191 and is about 300° C. By fixing the NEG 173 approximately at the middle of a heat transfer path between the connection portion 181 and the inner heater 192, the temperature of the NEG 173 can be heated to about 350° C. which is higher than the temperature of the connection portion 181 and lower than the temperature of the inner heater 192.

By doing this, it is possible to easily activate the NEG 173 without heating the NEG 173 with another heater during the baking of the electron gun.

Furthermore, the NEG 173 is activated by being heated at a relatively low temperature of about 350° C. for a long time instead of being heated at 450° C. for a short time which is an activation temperature of the NEG and has an ability to sorb residual gas around the electron source 101.

Advantages of heating the NEG 173 at about 350° C. for a long time rather than heating the NEG 173 to about 450° C. for a short period are the following three points.

(1) Since the NEG may be activated by using the heater 192 for heating the extraction electrode without using a separate heater and heater power supply, the structure of the interior of the electron gun is simplified, it is advantageous in reducing the number of residual gas molecules and at the same time it is possible to provide an inexpensive device.

(2) There is a case where a large amount of gas molecules emitted from the NEG at the time of activation to heat the NEG at about 450° C. for a short time and absorbed to the surrounding components or the electron source may adversely affect the performance of the electron source, but it is possible to make the generation of gas molecules from NEG slow to such an extent that the gas molecules are pumped by another vacuum pump, by heating the NEG at 350° C. for a long time. As a result, adsorption of gas molecules to the electron source is suppressed.

(3) When NEG is heated at about 450° C. for a long time, an active activation action lasts for a long time, and a large amount of gas molecules are occluded in the NEG. This shortens the lifetime of the NEG and reduces NEG pumping speed when the NEG is reactivated by electron source exchange or the like. In addition, it may be necessary to replace the NEG in order to obtain a necessary pumping speed.

According to experimental results using a large number of electron guns, it was founded that that NEG may be activated to such an extent that by keeping the NEG at about 350° C. within the baking time of 24 hours to 96 hours, a necessary pumping speed is obtained and overactivation does not occur. In the embodiment of the present invention, in order to maintain the NEG at about 350° C. by using the inner heater 192 heated to about 450° C., the extraction electrode 103 is provided with the NEG 173.

According to these embodiments, compared to the Cold-FE electron gun of the related art, residual gas molecules around the electron source are reduced, and a more stable emission current can be obtained without replacing the electron source for a longer period of time. Thereby, it is possible to obtain an electron microscope which does not require maintenance for a long period and may obtain a higher quality observation image.

REFERENCE SIGNS LIST

1: electron gun
10: electron beam
101: electron source
102: filament
103: extraction electrode
104: adjusting electrode
105: accelerating tube
106: interspace electrode
107: interspace electrode
108: interspace electrode
109: interspace electrode
110: anode
110: anode
121: anode aperture
17: electron gun vacuum pump (ion pump and the like)
171: ion pump
172: NEG (for accelerating tube base)
173 NEG (around electron source)
181: portion where extraction electrode is in contact with outer wall of electron gun <connection portion>
182: leading end portion of extraction electrode
191: heater for baking electron gun
192: inner heater
193: outer wall of accelerating tube
194: electron source periphery
2: electron optics system
21: electron optics system vacuum pump
3: specimen holder
31: specimen
4: detector
5: operation unit
6: power supply unit
62: electron gun power supply

The invention claimed is:

1. An electron microscope comprising:
an electron gun, wherein
the electron gun includes an electron source, an extraction electrode, and an accelerating tube,
the accelerating tube is connected to the extraction electrode at a connection portion,
the extraction electrode includes a first heater and a first NEG,
the first heater and the first NEG are spaced apart in an axial direction of an electron beam emitted from the electron source, and
the first heater is arranged on an outer surface of the extraction electrode extending in the axial direction of the electron beam.

2. The electron microscope according to claim 1, further comprising:
a second heater that is disposed around the accelerating tube.

3. The electron microscope according to claim 2, wherein the first NEG is provided between the first heater and the connection portion.

4. The electron microscope according to claim 3, wherein
the first heater is heated to 400° C. or higher,
the second heater is heated to 300° C. or higher,
the connection portion is heated by the second heater to a temperature lower than a temperature of the second heater, and
a temperature of the first NEG is higher than a temperature of the connection portion and lower than a temperature of the first heater.

5. The electron microscope according to claim 4, wherein the first heater is disposed in a vacuum container inside the electron gun.

6. The electron microscope according to claim 5, wherein the second heater is disposed outside the vacuum container.

7. The electron microscope according to claim 6, further comprising:
an ion pump, wherein
a second NEG is provided between an electrode having a ground level of the accelerating tube and the ion pump.

8. An electron microscope comprising:
an electron gun, wherein
the electron gun includes an extraction electrode and an accelerating tube,
the accelerating tube is connected to the extraction electrode at a connection portion,
the extraction electrode includes a first heater and a first NEG, the first heater heats the extraction electrode by constantly energizing during baking of the electron gun, and
the first NEG is heated by a thermal gradient between the first heater and the connection portion,
the first heater is arranged on an outer surface of the extraction electrode extending in the axial direction of the electron beam; and
the first heater and the first NEG are spaced apart in an axial direction of an electron beam emitted from the electron gun.

9. The electron microscope according to claim 8, further comprising:
a second heater for baking the electron gun around the accelerating tube.

10. The electron microscope according to claim 9, wherein
the first NEG is provided between the first heater and the connection portion.

11. The electron microscope according to claim 10, wherein
the first heater is heated to 400° C. or higher,
the second heater is heated to 300° C. or higher,
the connection portion is heated by the second heater to a temperature lower than a temperature of the second heater, and
a temperature of the first NEG is higher than a temperature of the connection portion and lower than a temperature of the first heater.

* * * * *